US010522882B2

(12) United States Patent  
Nagato

(10) Patent No.: US 10,522,882 B2  
(45) Date of Patent: Dec. 31, 2019

(54) SEMICONDUCTOR DEVICE, BATTERY PACK, AND MOBILE TERMINAL WITH MULTI-SPEED CPU

(71) Applicant: Renesas Electronics Corporation, Tokyo (JP)

(72) Inventor: Hidekazu Nagato, Tokyo (JP)

(73) Assignee: RENESAS ELECTRONICS CORPORATIONS, Tokyo (JP)

( * ) Notice: Subject to any disclaimer, the term of this patent is extended or adjusted under 35 U.S.C. 154(b) by 0 days.

(21) Appl. No.: 16/150,586

(22) Filed: Oct. 3, 2018

(65) Prior Publication Data

US 2019/0036177 A1    Jan. 31, 2019

Related U.S. Application Data

(63) Continuation of application No. 14/508,658, filed on Oct. 7, 2014, now Pat. No. 10,096,866.

(30) Foreign Application Priority Data

Nov. 12, 2013    (JP) ................................ 2013-234081

(51) Int. Cl.
*H01M 10/48*        (2006.01)
*G01R 31/389*       (2019.01)
(Continued)

(52) U.S. Cl.
CPC ...... *H01M 10/482* (2013.01); *G01R 31/3647* (2019.01); *G01R 31/389* (2019.01); *G01R 31/3842* (2019.01); *H01M 2010/4271* (2013.01)

(58) Field of Classification Search
CPC ............ G01R 31/362; G01R 31/3655; H01M 10/482

(Continued)

(56) References Cited

U.S. PATENT DOCUMENTS

| 5,670,861 A * | 9/1997 | Nor .................... G01R 31/3648 320/118 |
| 2008/0282018 A1 | 11/2008 | Nakanishi |
| 2012/0323512 A1 | 12/2012 | Rhodin |

FOREIGN PATENT DOCUMENTS

| JP | 2000-019233 A | 1/2000 |
| JP | 2000019233 A * | 1/2000 ............. B60K 6/543 |

(Continued)

OTHER PUBLICATIONS

Machine translation of JP 2000019233 A. (Year: 2018).*

(Continued)

*Primary Examiner* — David V Henze-Gongola
(74) *Attorney, Agent, or Firm* — McGinn IP Law Group, PLLC

(57) ABSTRACT

A semiconductor device includes a voltage measurement unit that measures an output voltage of a battery, a current measurement unit that measures a discharge current of the battery; and a controller that determines, in a first measurement mode, whether to employ a first discharge current as a power calculation current based on a difference between the first and a second discharge current, the second discharge current being the discharge current measured by the current measurement unit before the first discharge current is measured, in which the controller estimates an internal resistance of the battery based on the power calculation current and the output voltage measured in the first measurement mode and the discharge current and the output voltage measured in a second measurement mode, and calculates, based on the internal resistance that is estimated, a maximum power amount that can be output by the battery in the second measurement mode.

12 Claims, 11 Drawing Sheets

(51) Int. Cl.
  *G01R 31/36*    (2019.01)
  *G01R 31/3842*  (2019.01)
  *H01M 10/42*    (2006.01)
(58) Field of Classification Search
  USPC .......................................................... 324/430
  See application file for complete search history.

(56)        References Cited

FOREIGN PATENT DOCUMENTS

JP      2001-051029 A    2/2001
JP      2008-079059 A    3/2003
JP      2003-317811 A   11/2003
JP      2010-034016 A    2/2010
WO   WO 2010/109809 A1  9/2010

OTHER PUBLICATIONS

United States Notice of Allowance dated Jun. 5, 2018 in U.S. Appl. No. 14/508,658.
United States Office Action dated Mar. 8, 2018 in U.S. Appl. No. 14/508,658.
United States Office Action dated Aug. 3, 2017 in U.S. Appl. No. 14/508,658.
Japanese Office Action dated Jun. 27, 2017 with an English translation thereof.

* cited by examiner

SEMICONDUCTOR DEVICE, BATTERY PACK, AND MOBILE TERMINAL WITH MULTI-SPEED CPU

CROSS-REFERENCE TO RELATED APPLICATIONS

The present application is a Continuation Application of U.S. patent application Ser. No. 14/508,658, filed on Oct. 7, 2014, which is based on Japanese patent application No. 2013-234081, filed on Nov. 12, 2013, the disclosure of which is incorporated herein in its entirety by reference.

BACKGROUND

The present invention relates to a semiconductor device, a battery pack, and a mobile terminal.

Among the CPUs (Central Processing Units) in an internal circuit installed in mobile terminals such as notebook computers, there is a type of CPU that has a function of changing its operating frequency (hereinafter called "variable frequency function") in order to keep a balance among the power consumption, the calculation performance, and the reliability (life span). A CPU having the variable frequency function lowers the clock frequency (normal clock operation) in the normal operation state, and thereby prevents the increase of the power consumption, and/or maintains the CPU at a low temperature and thereby prevents the deterioration in the reliability. On the other hand, when the resource request from the application(s) increases, the CPU having the variable frequency function raises the clock frequency (high-speed clock operation) and thereby increases the calculation performance.

Note that when a CPU having a variable frequency function is driven by electric power supplied from an assembled battery in which a plurality of secondary battery cells are combined, the period of the high-speed clock operation and the clock frequency in the high-speed clock operation state are determined based on the amount of the electric power that can be output from a battery. For example, this CPU is formed so as to be able to select a plurality of clock frequencies higher than the clock frequency in the normal clock operation state as a clock frequency in the high-speed clock operation state, and the optimal clock frequency is selected based on the amount of the electric power that can be output from the battery at this time.

Meanwhile, the state of a battery implemented in a mobile terminal such as a notebook computer is monitored by a battery monitoring system accommodated in a battery pack together with the battery. The battery monitoring system typically includes a battery control IC (FGIC: Fuel Gauge IC), a sense resistance to detect charging and discharging currents of the battery as voltage information, a charge controlling MOS transistor, a discharge controlling MOS transistor, and a protection circuit such as a thermistor or a fuse. The battery control IC is formed to include, for example, a microcontroller, and achieves a battery remaining capacity management function, a function of controlling the charge controlling/discharge controlling MOS transistors, and a function of protecting the battery. The battery control IC generates information indicating the state of the battery based on the results of detecting the battery voltage and the charging and discharging currents of the battery to notify the internal circuit of the mobile terminal of the information. The information indicating the state of the battery includes, for example, a full charge capacity (FCC), a remaining capacity (RC) of the battery, and a state of charge (SOC) of the battery. Related techniques are disclosed in Japanese Unexamined Patent Application Publication Nos. 2010-34016, 2003-79059, and 2001-51029.

The battery control IC generates, in addition to the information indicating the battery state described above, information of a maximum power amount that can be supplied from the battery to the internal circuit based on the results of measuring the battery voltage and the discharge current of the battery. The information of the maximum power amount is notified as needed (e.g., once every second) to a PC system (internal circuit) of the notebook computer, and is used to determine the period of the high-speed clock operation and the clock frequency in the high-speed clock operation.

SUMMARY

In order for the CPU having the variable frequency function to perform the high-speed clock operation for an optimal period in the optimal clock frequency, more accurate information of the maximum power amount is required. The maximum power amount is calculated based on, for example, a minimum operating voltage and a maximum current that can be output by the battery in a range in which a power supply voltage applied to the PC system does not fall below the minimum operating voltage which guarantees the operation of the PC system.

In general, when there is a change in a discharge current of the battery according to the switching of the operation mode, an internal resistance of the battery changes, which causes changes in an output voltage of the battery. The power supply voltage applied to the PC system changes as well. Accordingly, the battery control IC needs to measure the discharge current of the battery and the battery voltage in each of the normal clock operation state and the high-speed clock operation state, estimate the internal resistance of the battery from the measurement results, and then calculate the maximum power amount.

The discharge current of the battery in the normal clock operation state does not vary constantly and varies according to the situation. Even in such a case, it is required that the battery control IC accurately measures the discharge current of the battery and the battery voltage in each of the normal clock operation state and the high-speed clock operation state, and then calculates the maximum power amount with high accuracy. The configurations in Japanese Unexamined Patent Application Publication Nos. 2010-34016, 2003-79059, and 2001-51029 do not take into account of the measurement of a battery voltage and a large current that occur unexpectedly for a short time. The other problems to be solved and the novel features will become apparent from the following description of this specification and the accompanying drawings.

According to one embodiment, a semiconductor device includes: a voltage measurement unit that measures an output voltage of a battery; a current measurement unit that measures a discharge current of the battery; and a controller that determines, in a first measurement mode, whether to employ a first discharge current as a power calculation current based on a difference between the first discharge current and a second discharge current, the first discharge current being the discharge current measured by the current measurement unit, and the second discharge current being the discharge current measured by the current measurement unit before the first discharge current is measured, in which: the controller estimates an internal resistance of the battery based on the power calculation current and the output voltage measured in the first measurement mode and the discharge current and the output voltage measured in a second measurement mode, and calculates, based on the internal resistance that is estimated, a maximum power amount that can be output by the battery in the second measurement mode.

According to the embodiment, it is possible to provide a semiconductor device, a battery pack, and a mobile terminal that are able to accurately calculate a maximum power amount that can be supplied from a battery.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments are explained hereinafter with reference to the drawings. It should be noted that the drawings are made in a simplified manner, and therefore the technical scope of the embodiments should not be narrowly interpreted based on those drawings. Further, the same components are assigned with the same symbols and their duplicated explanation is omitted.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may be also used.

Further, in the following embodiments, their components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the likes that are substantially similar to or resemble that shape are also included in that shape except for cases where it is explicitly specified or they are eliminated based on its principle. This is also true for the above-described number or the like (including numbers, values, quantities, ranges, and the like).

<First Embodiment>

Figure 1:
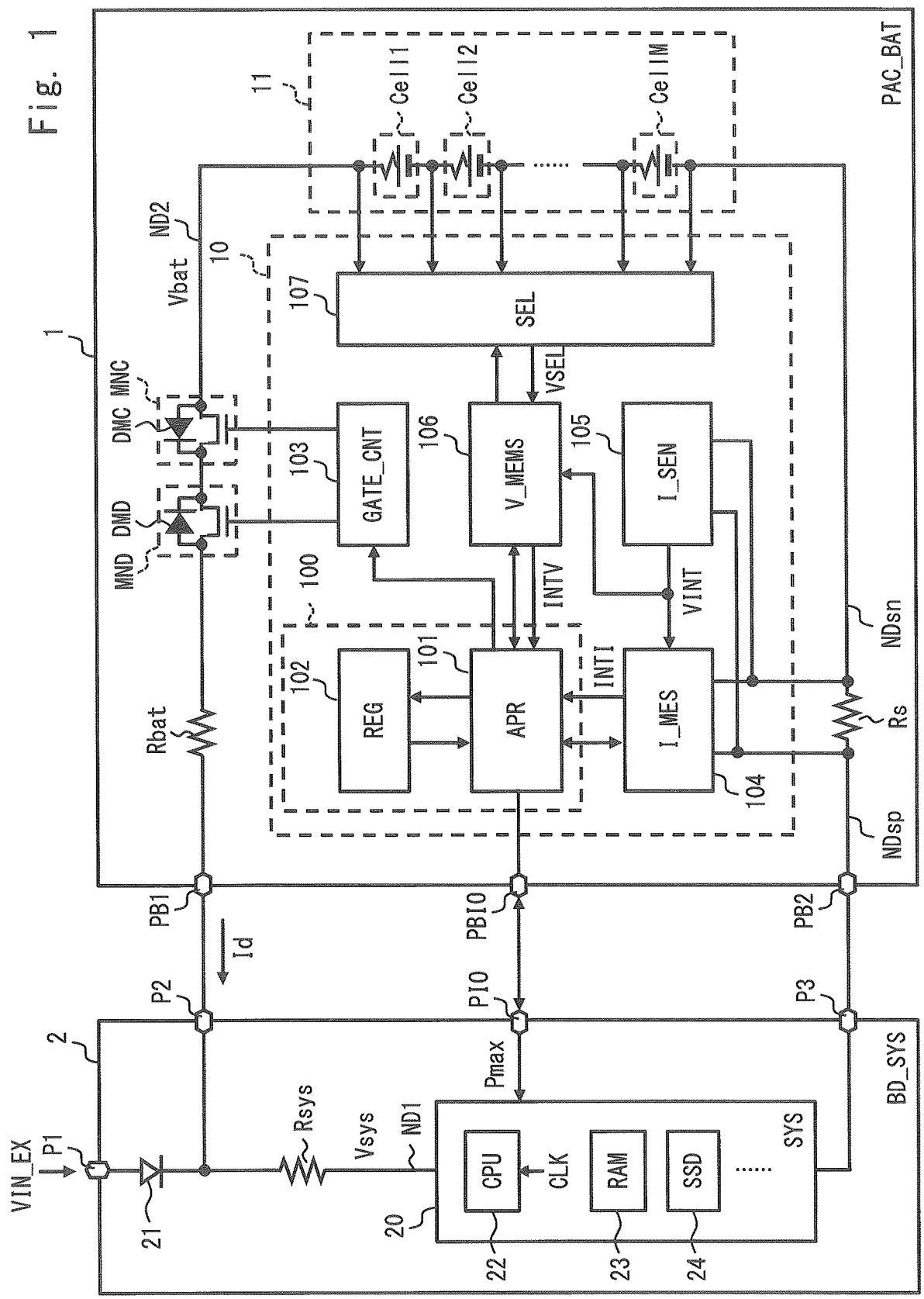
FIG. 1 is a block diagram showing a mobile terminal which accommodates a battery pack including a battery control IC according to a first embodiment.

FIG. 1 is a block diagram showing a mobile terminal which accommodates a battery pack including a battery control IC (semiconductor device) according to a first embodiment.

A mobile terminal shown in FIG. 1 includes a system board (BD_SYS) 2 and a battery pack (PAC_BAT) 1. The mobile terminal 200 is, for example, a notebook computer.

The system board 2 includes an internal circuit (SYS) 20 to implement functions of a mobile terminal such as a notebook computer and a plurality of external terminals. FIG. 1 representatively shows, as a plurality of external terminals of the system board 2, an external power supply terminal P1 that receives external power from an external power supply (e.g., AC adapter) VIN_EX, a high-potential side power supply terminal P2 and a low-potential side power supply terminal P3 connected to the battery pack 1, and an input/output terminal PIO to communicate with the battery pack 1. These elements forming the system board 2 are formed on a mounting board such as a printed circuit board.

The internal circuit 20 is driven by electric power supplied from the battery pack 1 through the high-potential side power supply terminal P2 and the low-potential side power supply terminal P3. A signal line that connects the high-potential side power supply terminal P2 and the internal circuit 20 includes a parasitic resistance component (hereinafter referred to as a parasitic resistance Rsys) such as a wiring resistance or a contact resistance of the external terminal. Further, when the external power supply VIN_EX is connected to the external power supply terminal P1, the internal circuit 20 is driven by both of the external power supplied from the external power supply VIN_EX through a diode 21 and the electric power supplied from the battery pack 1. This is because the maximum power of the external power supply VIN_EX is designed to be smaller than the maximum power required for a high-speed clock operation to reduce the weight, the power consumption, and the cost. The external power supplied from the external power supply VIN_EX is not only supplied to the internal circuit 20 but may be also supplied to the battery pack 1 as necessary to be used for charging an assembled battery 11.

The internal circuit 20 includes a plurality of semiconductor elements including, for example, a CPU (including a GPU) 22, a large capacity RAM (Random Access Memory) 23, and an SSD (Solid State Drive) 24.

The CPU 22 includes the variable frequency function described above. Specifically, the CPU 22 is formed so as to be able to switch between a normal clock operation mode in which an operation is performed in a clock frequency f1 and a high-speed clock operation mode in which an operation is performed in a clock frequency f2 which is higher than the clock frequency f1. In the normal state, for example, the internal circuit 20 is set to the normal clock operation mode, whereby an increase in the power consumption is suppressed, the temperature of the CPU 22 is kept low, and the reduction in reliability is suppressed. Meanwhile, when the resource request from the application(s) increases, the internal circuit 20 is set to the high-speed clock operation mode, thereby improving the calculation performance. However, when a clock frequency of the CPU 22 is made high for a long time, the power consumption increases or the chip temperature of the CPU 22 increases, which lowers the reliability. Therefore, the period during which the clock frequency is made high is set to be as short as, for example, 10 ms. When it is desired to successively operate the CPU 22 in the high-speed clock operation mode, the following control is performed. That is, after the operating period in the high-speed clock operation mode exceeds 10 ms, the mode is made back to the normal clock operation mode, and then after it is confirmed that the chip temperature of the CPU 22 decreases to a safe level, the mode is again made back to the high-speed clock operation mode.

The period during which the CPU 22 operates in the high-speed clock operation mode and the clock frequency f2 in the high-speed clock operation mode are determined based on a maximum power amount Pmax that can be supplied from the assembled battery 11 to the internal circuit 20. For example, the CPU 22 is formed to be able to select a plurality of clock frequencies f2_1 to f2_n (n is an integer equal to or greater than two) higher than the clock frequency f1 in the normal clock operation mode as the clock frequency f2 in the high-speed clock operation mode. When the mode transitions to the high-speed clock operation mode, an optimal clock frequency is selected from the clock frequencies f2_1 to f2_n based on the maximum power amount Pmax notified by the battery pack 1, and a clock signal CLK of the selected clock frequency is supplied to the CPU 22. For example, a high clock frequency is selected when the maximum power amount Pmax is large and a low clock frequency is selected when the maximum power amount Pmax is small. The detail of the maximum power amount Pmax will be described later.

The battery pack 1 includes an assembled battery (battery) 11, a battery control IC 10, a charge control transistor MNC, a discharge control transistor MND, a sense resistance Rs, and a plurality of external terminals. FIG. 1 representatively shows, as a plurality of external terminals of the battery pack 1, a high-potential side power supply terminal PB1 and a low-potential side power supply terminal PB2 of the assembled battery 11 and an input/output terminal PBIO to perform communication with the system board 2.

The high-potential side power supply terminal PB1 and the low-potential side power supply terminal PB2 are terminals to electrically connect the assembled battery 11 to an external device (internal circuit 20 on the system board 2). The high-potential side power supply terminal PB1 is connected to the high-potential side power supply terminal P2 on the system board 2, and the low-potential side power supply terminal PB2 is connected to the low-potential side power supply terminal P3 on the system board 2.

The assembled battery 11 is arranged between the high-potential side power supply terminal PB1 and the low-potential side power supply terminal PB2. In the assembled battery 11, a plurality of unit battery cells Cell 1 to Cell M (M is an integer equal to or greater than two) which can be charged and discharged are connected in series. While not particularly limited, the unit battery cells Cell 1 to Cell M are lithium ion secondary batteries. By increasing the number of unit battery cells that are connected in series, the voltage of the assembled battery 11 can be increased. Further, by connecting a plurality of unit battery cell groups in parallel, each of which being connected in series, the capacity of the assembled battery 11 can be increased. While the assembled battery 11 includes the plurality of unit battery cells in the example shown in FIG. 1, the assembled battery 11 may include only one unit battery cell when the power consumption of the system board 2 is small. The assembled battery 11 generates an output voltage Vbat in a positive-side electrode (node ND2).

The charge control transistor MNC and the discharge control transistor MND are turned on or off based on a control signal output from the battery control IC 10. The charge control transistor MNC and the discharge control transistor MND are transistors that can output a large current, and may be, for example, IGBTs or power MOS transistors. In the example shown in FIG. 1, both of the charge control transistor MNC and the discharge control transistor MND are formed of N-channel power MOS transistors. The charge control transistor MNC and the discharge control transistor MND are provided in series between the high-potential side power supply terminal PB1 and the node ND2 so that the drain electrodes (cathodes of body diodes) of the charge control transistor MNC and the discharge control transistor MND are opposed to each other. The charge control transistor MNC and the discharge control transistor MND are able to interrupt the electrical connection between the assembled battery 11 and the external device (system board 2). By turning on the charge control transistor MNC, the assembled battery 11 can be charged. At this time, the discharge control transistor may either be ON or OFF. When the discharge control transistor MND is turned off, a charge current is supplied from the external power supply VIN_EX to the assembled battery 11 through the diode 21 of the system board 2, a body diode DMD of the discharge control transistor MND, and the charge control transistor MNC. Further, the discharge of the assembled battery 11 is enabled by turning on the discharge control transistor MND. At this time, the charge control transistor MNC may be either turned on or off. When the charge control transistor MNC is turned off, a discharge current Id is supplied from the assembled battery 11 to the internal circuit 20 through a body diode DMC of the charge control transistor MNC and the discharge control transistor MND.

A signal line that connects the high-potential side power supply terminal PB1 of the battery pack 1 and the positive-side electrode (node ND2) of the assembled battery 11 includes a parasitic resistance component (hereinafter referred to as a parasitic resistance Rbat) such as a wiring resistance or a contact resistance of the external terminal.

The sense resistance Rs detects a current input to or output from the assembled battery 11 (charge current and discharge current) as a voltage. The sense resistance Rs is provided, for example, between a negative-side electrode (node NDsn) of the assembled battery 11 and the low-potential side power supply terminal PB2 (node NDsp) of the battery pack 1. The voltages at both ends of the sense resistance Rs is detected as information of the charge current or the discharge current, and are input to the battery control IC 10.

The battery control IC 10 monitors the state of the assembled battery 11 and controls execution and stop of charge and discharge of the assembled battery 11. While not particularly limited, the battery control IC 10 is a one-chip microcontroller that is formed in a semiconductor substrate using a known technique of manufacturing CMOS integrated circuits.

Specifically, the battery control IC 10 has a function of measuring a discharge current value Ia and an output voltage value Va of the assembled battery 11 in the normal clock operation mode, and a discharge current value Ib and an output voltage value Vb of the assembled battery 11 in the high-speed clock operation mode, estimating, from the measurement results, an internal resistance RCELL of the assembled battery 11, and calculating the maximum power amount Pmax based on the internal resistance RCELL that is estimated. The battery control IC 10 further has a function of determining whether to employ the latest discharge current value as the discharge current value Ia used for the calculation of the maximum power amount Pmax based on the difference between the latest discharge current value measured in the normal clock operation mode and the discharge current value that is previously measured. The battery control IC 10 may further has a function of determining the operation mode of the CPU 22 by monitoring the discharge current Id of the assembled battery 11. Hereinafter, the configuration of the battery control IC 10 will be described in more detail.

The battery control IC 10 includes a data processing controller (controller) 100, a gate controller (GATE_CNT) 103, a selection unit (SEL) 107, a voltage measurement unit (V_MES) 106, a current measurement unit (I_MES) 104, and a mode determination unit (I_SEN) 105.

The selection unit 107 selects a voltage to be measured according to an instruction from the data processing controller 100. The selection unit 107 selects, for example, the output voltage of each of the unit battery cells Cell 1 to Cell M one by one and outputs the selected voltage as a voltage VSEL.

The voltage measurement unit 106 measures the voltage VSEL output from the selection unit 107. The voltage measurement unit 106 includes, for example, an A/D converter 1061. The A/D converter 1061 converts the voltage VSEL output from the selection unit 107 into a digital value at a predetermined cycle (e.g., 8 ms) to measure the output voltage of each of the unit battery cells Cell 1 to Cell M. The A/D converter 1061 is, for example, a ΔΣ A/D conversion circuit.

Further, the voltage measurement unit 106 calculates the output voltage Vbat of the assembled battery 11 based on the measurement value of the output voltage of each of the unit battery cells Cell 1 to Cell M. The voltage measurement unit 106 adds, for example, the output voltage of each of the unit battery cells Cell 1 to Cell M that are connected in series to calculate the output voltage Vbat of the assembled battery 11. The measurement result of the voltage measurement unit 106 is stored in a predetermined register in a register unit 102. The data storage in the register unit 102 may be performed by the voltage measurement unit 106 by directly accessing the register unit 102, or may be performed through an operation unit 101.

The current measurement unit 104 measures the charging and discharging currents of the assembled battery 11. The current measurement unit 104 includes, for example, an A/D converter 1041. The A/D converter 1041 converts the voltages at both ends of the sense resistance Rs into digital values at a predetermined cycle, so as to perform measurement of the charging and discharging currents of the assembled battery 11. The current measurement unit 104 further includes a coulomb counter. The coulomb counter integrates the measurement values of the charge current and the discharge current, thereby generating information of the charged and discharged charge amounts. The A/D converter 1041 is, for example, a ΔΣ A/D conversion circuit. The measurement result of the current measurement unit 104 is stored in a predetermined register in the register unit 102. The data storage in the register unit 102 may be performed by the current measurement unit 104 by directly accessing the register unit 102, or may be performed through the operation unit 101.

The gate controller 103 generates a control signal to control ON/OFF of the charge control transistor MNC and the discharge control transistor MND according to an instruction from the data processing controller 100. As shown in FIG. 1, the gate controller 103 may directly drive the charge control transistor MNC and the discharge control transistor MND. Otherwise, a pre-driver circuit may be arranged in outside of the battery control IC 10, and the pre-driver circuit may drive the charge control transistor MNC and the discharge control transistor MND based on the control signal output from the gate controller 103.

The data processing controller 100 integrally controls each function unit in the battery control IC 10 and performs various operations. Further, the data processing controller 100 transmits or receives data to or from the internal circuit 20 provided in the system board 2 through an external interface circuit (not shown). Specifically, the data processing controller 100 is implemented by a program processing apparatus at least including a CPU that executes arithmetic operations and control according to a program, a non-volatile storage unit (e.g., mask ROM, flash memory) that stores the program, and a volatile storage unit (RAM) that stores results of the arithmetic operations.

FIG. 1 representatively shows, as the data processing controller 100, the operation unit (APR) 101 as function implementation means that implements a control function and an operation function by the data processing controller 100 and the register unit (REG) 102 including a plurality of registers that store the programs used for the arithmetic operations and the control and the results of the arithmetic operations. The register unit 102 stores various parameters including a resistance value of the sense resistance Rs, a resistance value of each of the parasitic resistances Rsys and Rbat, an ON resistance of each of the charge control transistor MNC and the discharge control transistor MND, a forward voltage of each of the body diodes DMC and DMD, and a minimum operation voltage Vmin. The register unit 102 also stores the measurement results by the voltage measurement unit 106 and the current measurement unit 104 as described above.

The operation unit 101 executes various operations based on the charge current value and the discharge current value measured by the current measurement unit 104 and the voltage of the unit battery cells Cell 1 to Cell M measured by the voltage measurement unit 106, thereby generating information indicating the state of the assembled battery 11. Specifically, the operation unit 101 generates, as information indicating the state of the assembled battery 11, a full charge capacity FCC, a remaining capacity RC of the assembled battery 11, the charge state SOC of the assembled battery 11 and the like, and generates information of the maximum power amount Pmax. The operation unit 101 transmits information indicating the state of the assembled battery 11 to the internal circuit 20 in the system board 2 through the input/output terminal PBIO. The timing at which the operation unit 101 transmits the maximum power amount Pmax to the internal circuit 20 is determined based on a request from the internal circuit 20. The operation unit 101 transmits, for example, the information of the maximum power amount Pmax for each second based on the request from the internal circuit 20. A specific calculation method of the maximum power amount Pmax will be described later.

Further, the operation unit 101 determines whether to employ the latest discharge current value as the discharge current value Ia in the normal clock operation mode based on the difference between the latest discharge current value measured in the normal clock operation mode and the discharge current value that is previously measured. When, for example, the difference between the latest discharge current value and the previous discharge current value is within a predetermined range, the operation unit 101 employs the latest discharge current value as the discharge current value Ia in the normal clock operation mode. When the difference is outside the predetermined range, the operation unit 101 does not employ the latest discharge current value as the discharge current value Ia in the normal clock operation mode. In this way, it is possible to calculate the maximum power amount Pmax with high accuracy using the discharge current value Ia with high reliability. The detail of the processing for updating the discharge current value Ia will be described later with the specific method for calculating the maximum power amount Pmax.

The mode determination unit 105 determines whether the operation mode of the CPU 22 is the normal clock operation mode or the high-speed clock operation mode. The mode determination unit 105 is a current detection unit which determines that the operation mode of the CPU 22 is the normal clock operation mode when the discharge current Id is equal to or lower than a threshold current Ith and determines that the operation mode of the CPU 22 is the high-speed clock operation mode when the discharge current Id is larger than the threshold current Ith. In this embodiment, a case in which the mode determination unit 105 is a current detection unit (hereinafter referred to as a current detection unit 105) will be described as an example.

(Specific Configuration Example of Current Detection Unit 105)

Figure 2:
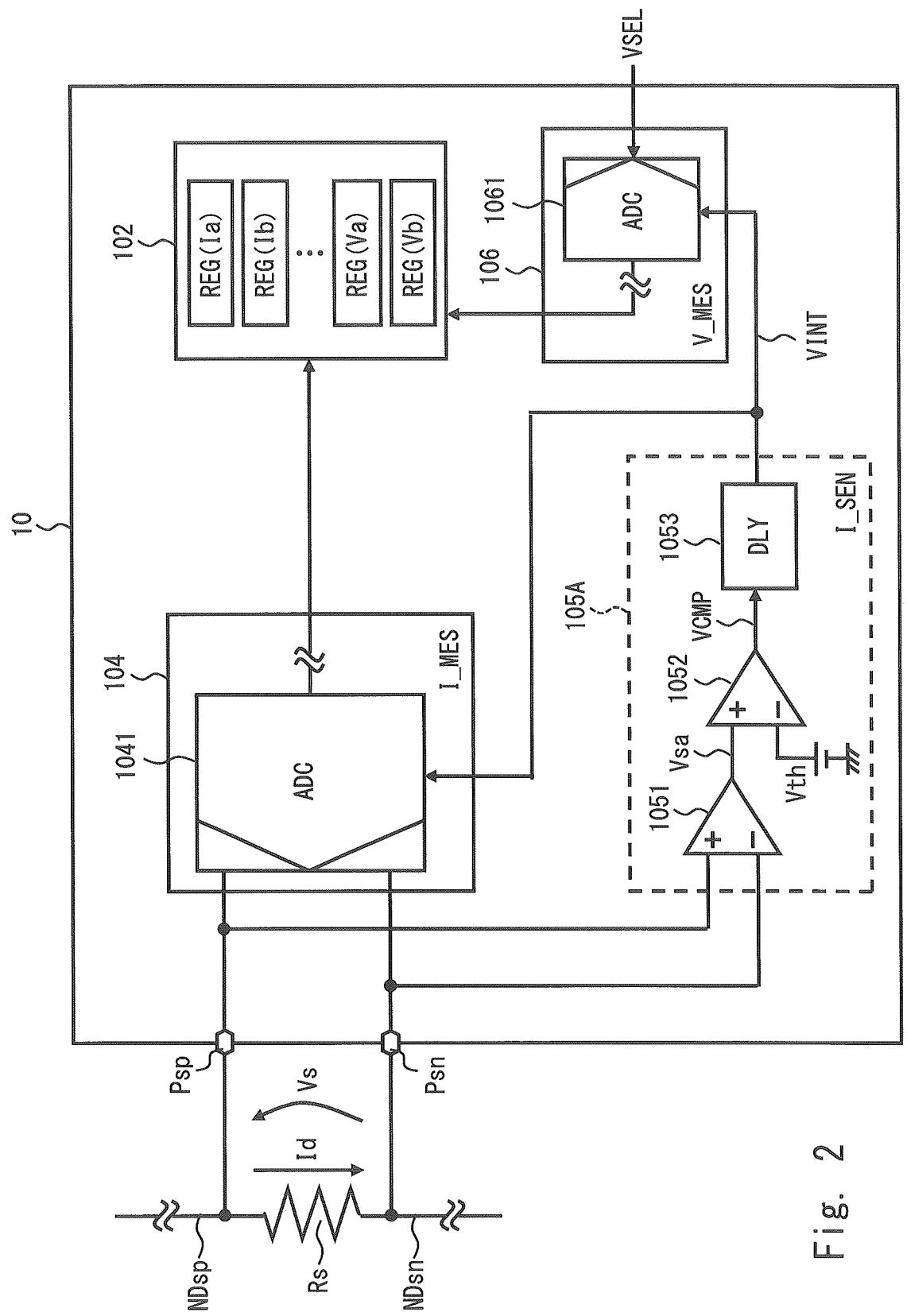
FIG. 2 is a diagram showing a specific configuration example of a current detection unit 105.

FIG. 2 is a diagram showing one example of a specific configuration of the current detection unit 105 as a current detection unit 105A. FIG. 2 also shows the register unit 102, the current measurement unit 104, the voltage measurement unit 106, and the sense resistance Rs.

The current detection unit 105A shown in FIG. 2 includes a differential amplifier (AMP) 1051, a comparator (CMP) 1052, and an output signal generation unit (DLY) 1053.

The differential amplifier 1051 amplifies the detection voltage (voltage at both ends of the sense resistance Rs) Vs input through external terminals Psp and Psn of the battery control IC 10 to output the amplified voltage as a voltage Vsa. When the amplification factor of the differential amplifier 1051 is 100 times, for example, the differential amplifier 1051 amplifies the detection voltage Vs of 1 mV generated by the discharge current Id of 500 mA that flows through the sense resistance Rs of 2 mΩ to 100 mV to output the amplified voltage as the voltage Vsa.

The comparator 1052 compares the voltage Vsa output from the differential amplifier 1051 with a threshold voltage Vth according to the threshold current Ith to output a comparison result VCMP. The comparator 1052 sets the signal level of the comparison result VCMP to the low level when, for example, the voltage Vsa is equal to or lower than the threshold voltage Vth, and the signal level of the comparison result VCMP to the high level when, for example, the voltage Vsa is higher than the threshold voltage Vth. The threshold current Ith is a reference value to determine whether the CPU 22 of the internal circuit 20 operates in the high-speed clock operation mode or in the normal clock operation mode. For example, the threshold current Ith is set to a value larger than an assumed value of the discharge current when the CPU 22 is operated in the normal clock operation mode and smaller than an assumed value of the discharge current when the CPU 22 is operated in the high-speed clock operation mode. The threshold voltage Vth is a reference voltage that is set according to the threshold current Ith. When it is detected by the comparator 1052 that the discharge current Id has exceeded the threshold current Ith, the output signal generation unit 1053 generates an interrupt signal VINT. When the state in which the discharge current Id exceeds the threshold current Ith continues for a predetermined period TD or more, for example, the output signal generation unit 1053 generates the interrupt signal VINT.

Figure 3:
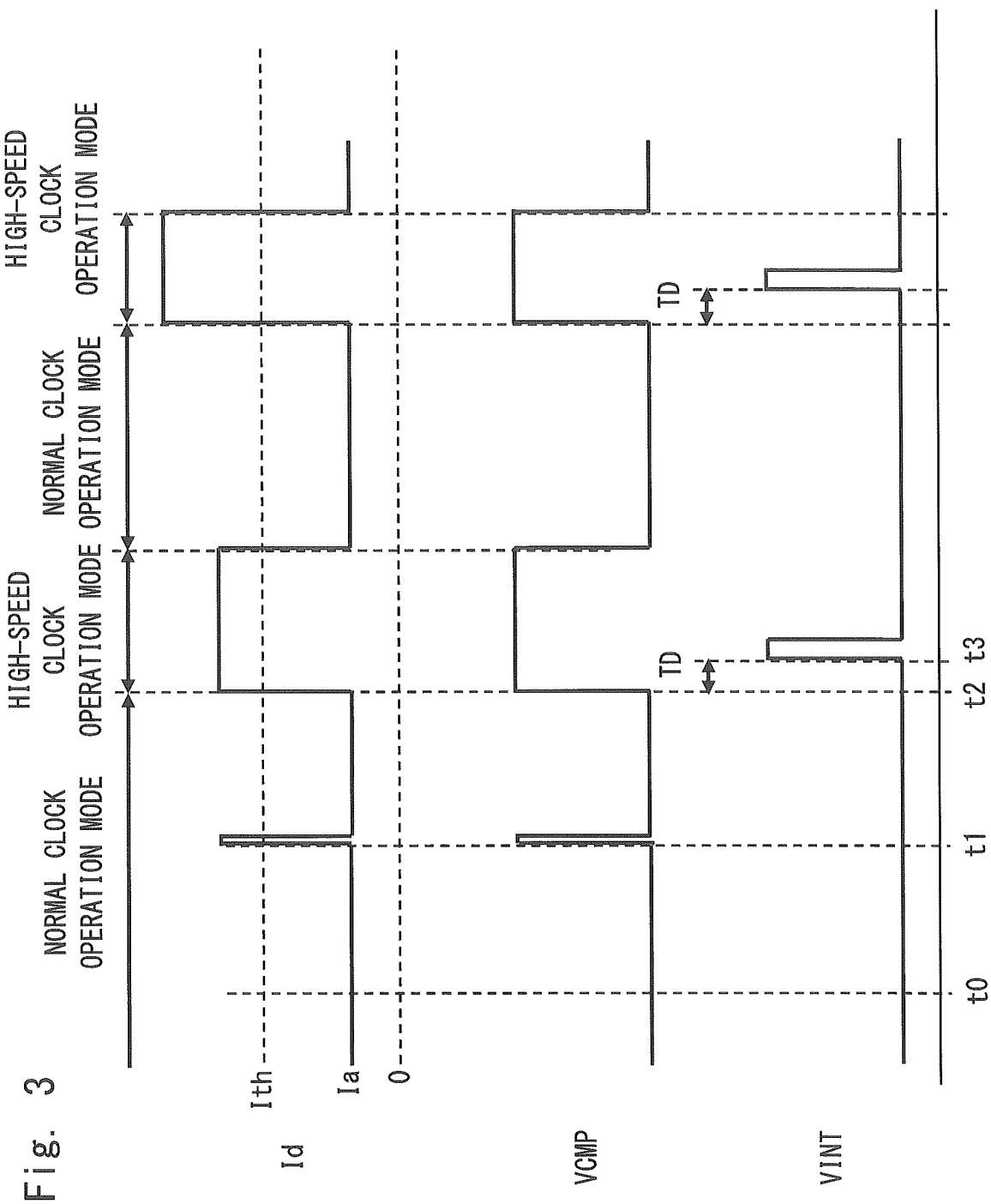
FIG. 3 is a timing chart showing an operation of the current detection unit 105.

FIG. 3 is a timing chart showing an operation of the current detection unit 105A.

First, at time t0, the CPU 22 operates in the normal clock operation mode. At this time, the discharge current Id indicates a value equal to or lower than the threshold current Ith. Further, at this time, the comparison result VCMP of the comparator 1052 indicates the L level. The output signal generation unit 1053 therefore does not generate the interrupt signal VINT.

Next, at time t1, when the discharge current Id instantaneously exceeds the threshold current Ith due to the influence of noise or the like, the comparison result VCMP of the comparator 1052 changes from the L level to the H level. Since the period during which the comparison result VCMP indicates the H level is equal to or shorter than a predetermined period TD, the output signal generation unit 1053 does not generate the interrupt signal VINT.

Next, when the operation mode of the CPU 22 changes from the normal clock operation mode to the high-speed clock operation mode at time t2, the discharge current Id exceeds the threshold current Ith. The comparison result VCMP of the comparator 1052 then changes from the L level to the H level again. Since the period during which the comparison result VCMP indicates the H level exceeds the predetermined period TD, the output signal generation unit 1053 generates the interrupt signal VINT when the predetermined period TD has passed after the comparison result VCMP becomes the H level. While not particularly limited, the interrupt signal VINT is a one-shot pulse signal.

As described above, the current detection unit 105A is able to easily determine whether the discharge current Id has exceeded the threshold current Ith. Further, since the current detection unit 105A generates the interrupt signal VINT only when the state in which the discharge current Id exceeds the threshold current Ith continues for a predetermined period, it is possible to prevent a false detection of the instantaneous increase in the discharge current due to noise or the like. Further, the current detection unit 105A is able to reduce the resistance value of the sense resistance Rs by providing the amplification unit (differential amplifier 1051) at the previous stage of the comparator 1052, thereby being able to reduce the loss generated in the sense resistance Rs.

(Another Specific Configuration Example of Current Detection Unit 105)

Figure 4:
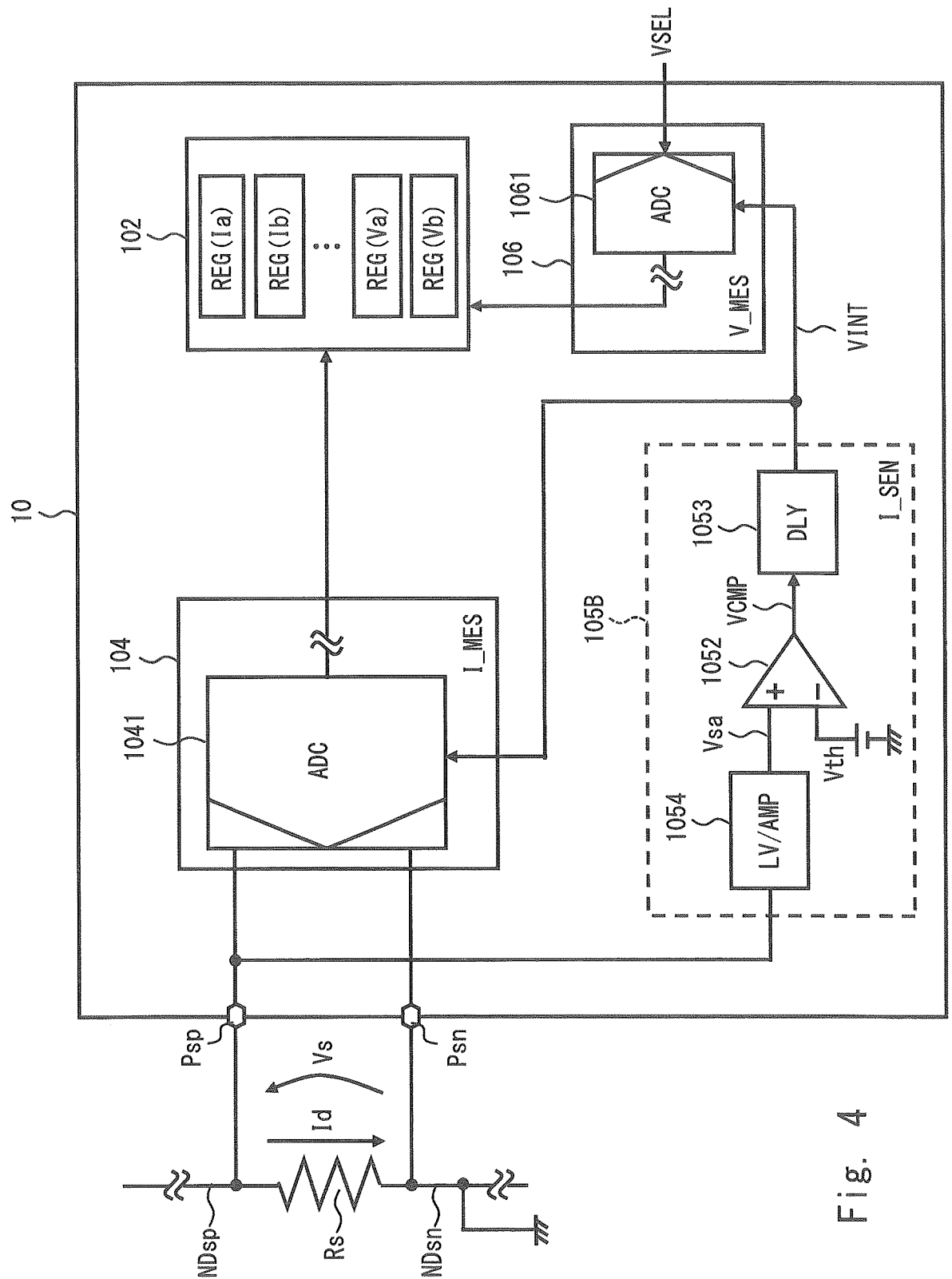
FIG. 4 is a diagram showing another specific configuration example of the current detection unit 105.

FIG. 4 is a diagram showing another specific configuration example of the current detection unit 105 as a current detection unit 105B. Compared to the current detection unit 105A, the current detection unit 105B includes a level shifter and gain adjustment circuit (LV/AMP) 1054 in place of the differential amplifier 1051.

In the example shown in FIG. 4, one end (node NDsn) of the sense resistance Rs is grounded. In the current detection unit 105B, the level shifter and gain adjustment circuit 1054 amplifies the voltage of the other end (node NDsp) of the sense resistance Rs to output the amplified voltage as the voltage Vsa. Since the other configurations and operations of the current detection unit 105B are similar to those of the current detection unit 105A, the descriptions thereof will be omitted. In this way, the current detection unit 105B is able to achieve the same effects as in the current detection unit 105A.

Next, operations of the voltage measurement unit 106 and the current measurement unit 104 will be described in detail.

When the operation mode of the CPU 22 is the normal clock operation mode (so-called normal mode), the voltage measurement unit 106 regularly executes measurement of the output voltage of each of the unit battery cells Cell 1 to Cell M and calculation of the output voltage Vbat of the assembled battery 11. Further, even when the operation mode of the CPU 22 changes from the normal clock operation mode to the high-speed clock operation mode, the voltage measurement unit 106 executes measurement of the output voltage of each of the unit battery cells Cell 1 to Cell M and calculation of the output voltage Vbat of the assembled battery 11. In this example, the voltage measurement unit 106 determines, when the interrupt signal VINT is issued, that the operation mode of the CPU 22 has changed to the high-speed clock operation mode to execute measurement of the output voltage of each of the unit battery cells Cell 1 to Cell M and calculation of the output voltage Vbat of the assembled battery 11. The output voltage Vbat that is calculated is stored in the register unit 102.

As already stated, the period in which the CPU 22 operates in the high-speed clock operation mode is as short as about 10 ms. Therefore, the voltage measurement unit 106 may not be able to complete the measurement of the output voltages of all the unit battery cells Cell 1 to Cell M within the period. In this case, the battery control IC 10 selects one unit battery cell indicating the minimum output voltage in the normal clock operation mode, and measures the output voltage of the selected unit battery cell in the high-speed clock operation mode using the voltage measurement unit 106. The battery control IC 10 then treats the value obtained by multiplying the measurement value by M (by the number of unit battery cells that are connected in series) as the output voltage Vbat of the assembled battery 11 in the high-speed clock operation mode.

The current measurement unit 104 regularly executes measurement of the charging and discharging currents of the assembled battery 11 in the normal state. Further, the current measurement unit 104 executes measurement of the charging and discharging currents of the assembled battery 11 also when the operation mode of the CPU 22 is changed from the normal clock operation mode to the high-speed clock operation mode. In this example, the current measurement unit 104 determines that the operation mode of the CPU 22 has moved to the high-speed clock operation mode when the interrupt signal VINT is issued and executes measurement of the charging and discharging currents of the assembled battery 11.

As described above, the period during which the CPU 22 operates in the high-speed clock operation mode is as short as about 10 ms. Therefore, the current measurement unit 104 may not be able to complete the measurement of the charging and discharging currents of the assembled battery 11 within the period. The current measurement unit 104 may have a function of, for example, suspending the measurement operation which is regularly executed in the normal state, lowering the resolution of the A/D conversion, and executing a new current measurement when the operation mode of the CPU 22 changes to the high-speed clock operation mode (upon occurrence of the interrupt signal VINT).

(Method of Calculating Maximum Power Amount Pmax)

Next, a method of calculating the maximum power amount Pmax by the battery control IC 10 will be described in detail.

As described above, the maximum power amount Pmax is the maximum power amount that can be supplied from the assembled battery 11 to the internal circuit 20, and is calculated based on the product of the minimum operation voltage and a maximum current that can be supplied from the assembled battery 11 in a range in which the power supply voltage applied to the internal circuit 20 does not fall below the minimum operation voltage that guarantees the operation of the internal circuit 20. Hereinafter, the detail will be described.

Figure 5:
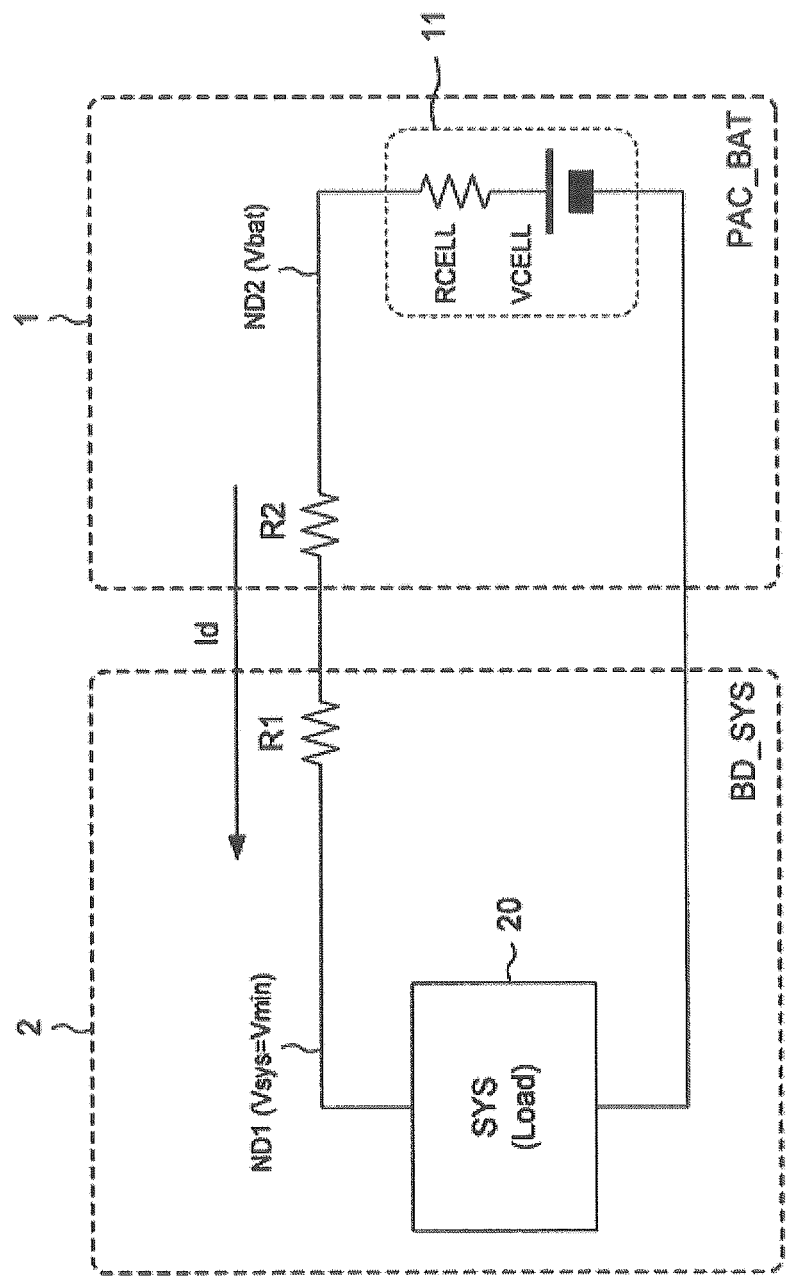
FIG. 5 is a diagram for describing a method of calculating a maximum power amount Pmax by the battery control IC according to the first embodiment.

FIG. 5 is a diagram for describing the method of calculating the maximum power amount Pmax. In FIG. 5, the power supply path from the assembled battery 11 to the internal circuit 20 is simplified. Further, in FIG. 5, the plurality of unit battery cells Cell 1 to Cell M forming the assembled battery 11 are simplified as one unit battery cell. In FIG. 5, VCELL represents a total cell voltage of the unit battery cells Cell 1 to Cell M, RCELL represents the total internal resistance of the unit battery cells Cell 1 to Cell M, R1 represents a resistance on the side of the system board 2 including the parasitic resistance Rsys, and R2 represents a resistance on the side of the battery pack 1 including the ON resistance of the discharge control transistor MND and the parasitic resistance Rbat. In FIG. 5, the voltage drop by the body diode DMC of the charge control transistor MNC is neglected.

As shown in FIG. 5, when power is supplied to the internal circuit 20 from the assembled battery 11, the discharge current Id flows from the positive-side electrode (node ND2) of the assembled battery 11 to the high-potential side power supply terminal (node ND1) of the internal circuit 20. At this time, the power supply voltage Vsys (voltage of the node ND1) applied to the internal circuit 20 can be expressed as shown in Expression (1).

$$Vsys = VCELL - Id(R1 + R2 + RCELL) \quad (1)$$

Further, since the power supply voltage Vsys applied to the internal circuit 20 should not fall below the minimum operation voltage Vmin that guarantees the operation of the internal circuit 20, Expression (2) is established.

$$V\min \leq Vsys \quad (2)$$
$$Id \leq \frac{VCELL - V\min}{R1 + R2 + RCELL}$$

From Expression (2), a maximum current Imax that can be supplied from the assembled battery 11 to the internal circuit 20 in a range in which the power supply voltage Vsys applied to the internal circuit 20 does not fall below the minimum operation voltage Vmin can be expressed as shown in Expression (3).

$$I\max = \frac{VCELL - V\min}{R1 + R2 + RCELL} \quad (3)$$

Further, the total cell voltage VCELL can be expressed as shown in Expression (4). Note that Va represents the value of the output voltage Vbat of the assembled battery 11 in the normal clock operation mode, and Ia represents the value of the discharge current Id of the assembled battery 11 in the normal clock operation mode. The detail of the processing for updating the discharge current value Ia will be described later.

$$VCELL = Va - RCELL \times Ia \quad (4)$$

By substituting Expression (4) into Expression (3), the maximum current Imax can be expressed as Expression (5).

$$I\max = \frac{(Va - RCELL \times Ia) - V\min}{R1 + R2 + RCELL} \quad (5)$$

Accordingly, the maximum power amount Pmax that can be supplied from the assembled battery 11 to the internal circuit 20 in the high-speed clock operation mode can be expressed as Expression (6).

$$\begin{aligned} P\max &= V\min \times I\max \\ &= V\min \times \frac{(Va - RCELL \times Ia) - V\min}{R1 + R2 + RCELL} \end{aligned} \quad (6)$$

When the value of the output voltage Vbat of the assembled battery 11 in the high-speed clock operation mode is represented by Vb and the value of the discharge current Id in the high-speed clock operation mode is represented by Ib, the internal resistance RCELL of the assembled battery 11 can be expressed as Expression (7).

$$RCELL = \frac{|Va - Vb|}{|Ia - Ib|} \quad (7)$$

As will be understood from Expression (7), the battery control IC 10 is able to estimate the internal resistance RCELL of the assembled battery 11 by measuring the discharge current value Ia and the output voltage value Va of the assembled battery 11 in the normal clock operation mode and the discharge current value Ib and the output voltage value Vb of the assembled battery 11 in the high-speed clock operation mode. The battery control IC 10 is able to calculate the maximum power amount Pmax by substituting the internal resistance RCELL that is estimated into Expression (6).

As will be understood from Expression (6) and Expression (7), in order to obtain the accurate maximum power amount Pmax, it is required to estimate the internal resistance RCELL using the discharge current value Ia which is highly reliable. The battery control IC 10 according to this embodiment employs a value of the discharge current Id which is highly reliable from the discharge current Id regularly measured in the normal clock operation mode as the discharge current value Ia to estimate the internal resistance RCELL, thereby calculating the maximum power amount Pmax with high accuracy.

(Flow of Processing for Calculating Maximum Power Amount Pmax)

Next, with reference to FIGS. 6, 7, and 8, a flow of processing for calculating the maximum power amount Pmax by the battery control IC 10 will be described.

Figure 6:
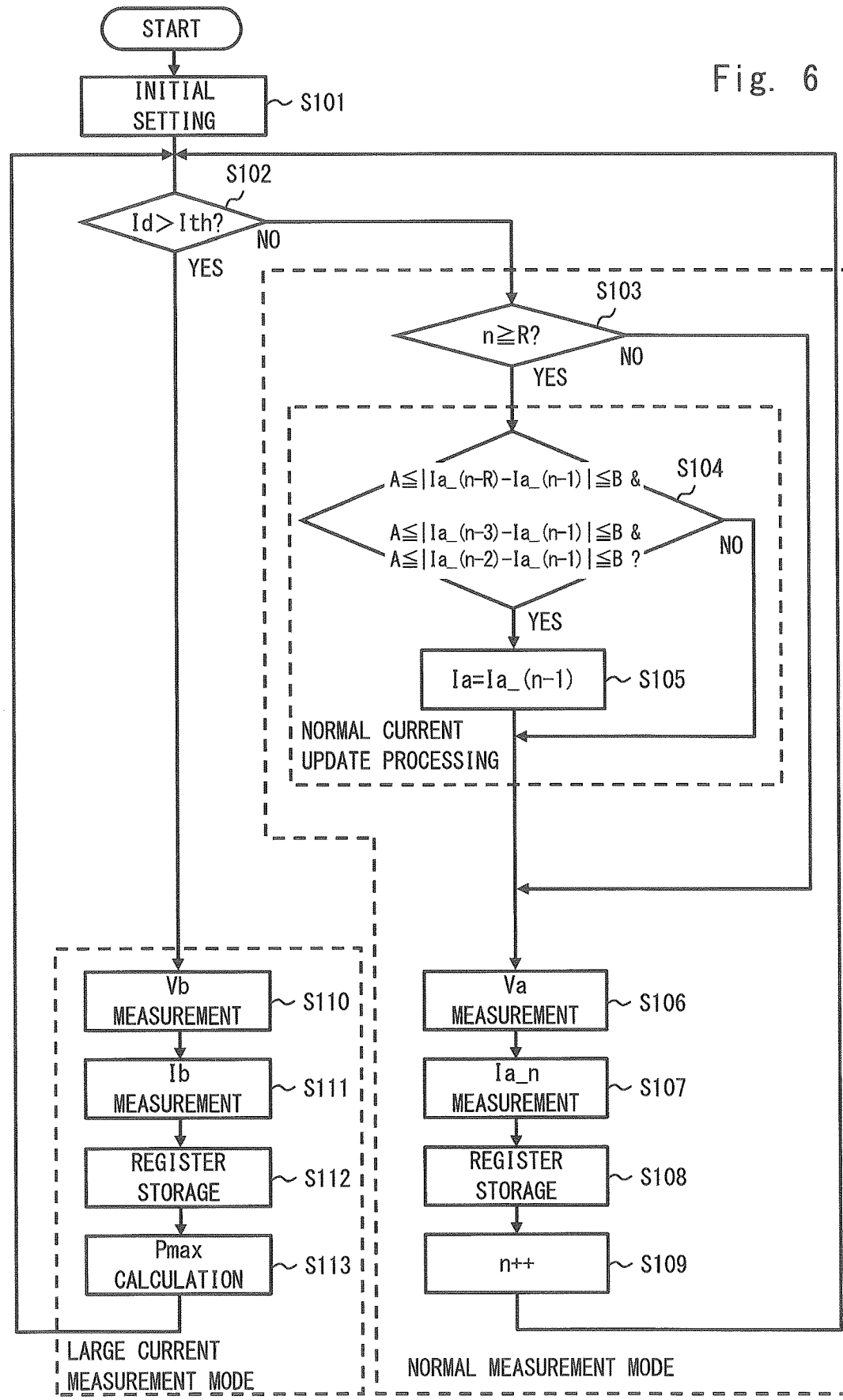
FIG. 6 is flowchart showing a flow of processing for calculating the maximum power amount Pmax by the battery control IC according to the first embodiment.
Figure 7:
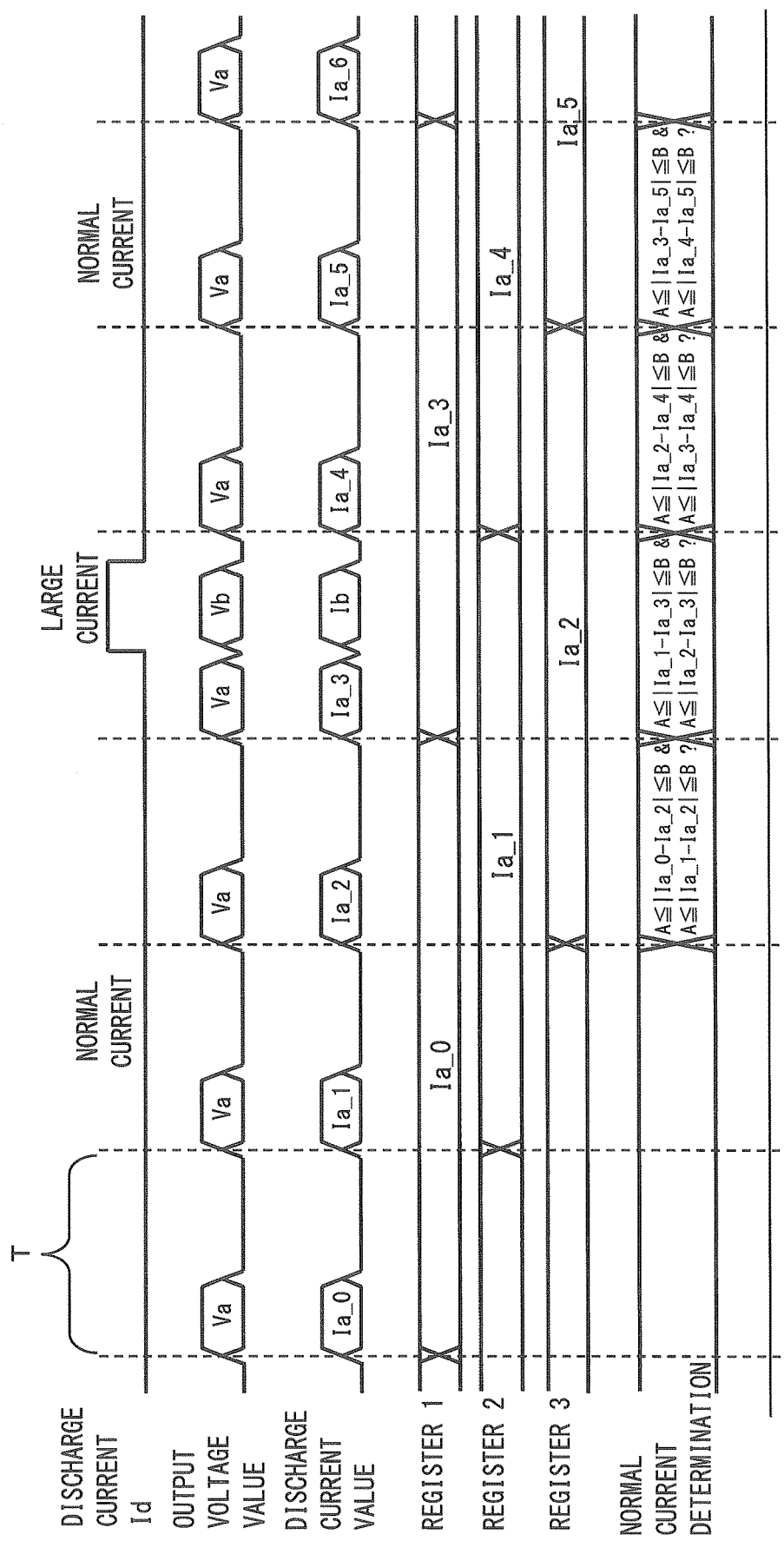
FIG. 7 is a timing chart showing an operation of the battery control IC according to the first embodiment.

FIG. 6 is a flowchart showing a flow of the processing for calculating the maximum power amount Pmax by the battery control IC 10. FIG. 7 is a timing chart showing an operation of the battery control IC 10. FIG. 8 is a timing chart for describing processing for updating the discharge current value Ia.

When a power-on reset is released, for example, the battery control IC 10 starts processing related to the calculation of the maximum power amount Pmax.

First, the battery control IC 10 performs an initial setting (Step S101). More specifically, the battery control IC 10 stores various parameters including the resistance value of the sense resistance Rs, the resistance value of each of the parasitic resistances Rsys and Rbat, the ON resistance of each of the charge control transistor MNC and the discharge control transistor MND, the forward voltage of each of the body diodes DMC and DMD, and the minimum operation voltage Vmin in the register unit 102. Further, the battery control IC 10 sets a variable n (n is an integer equal to or greater than zero), a comparison number R (R is an integer equal to or greater than two), predetermined values A and B (A<B), a measurement cycle T and the like. In this example, the variable n is set to "0" and the comparison number R is set to "3". These parameters are supplied, for example, from the internal circuit 20 to the battery control IC 10. The battery control IC 10 sets, after the initial setting, the current measurement unit 104 and the voltage measurement unit 106 to an enable state, thereby starting the measurement of the battery voltage and the charging and discharging currents of the assembled battery 11 and starting monitoring the state of the assembled battery 11.

Next, the battery control IC 10 determines the operation mode of the CPU 22 (Step S102). For example, when the discharge current Id of the assembled battery 11 is equal to or lower than the threshold current Ith (No in Step S102), the battery control IC 10 determines that the operation mode of the CPU 11 is the normal clock operation mode. When the discharge current Id of the assembled battery 11 exceeds the threshold current Ith (Yes in Step S102), the battery control IC 10 determines that the operation mode of the CPU 11 is the high-speed clock operation mode.

First, when the discharge current Id of the assembled battery 11 is equal to or lower than the threshold current Ith (No in Step S102), the battery control IC 10 determines that the operation mode of the CPU 11 is the normal clock operation mode and sets the measurement mode to the normal measurement mode (first measurement mode).

In the normal measurement mode, n and R are first compared (Step S103).

When, for example, n≥R is not satisfied (No in Step S103), the voltage measurement unit 106 measures the output voltage Vbat of the assembled battery 11 (Step S106). Further, the current measurement unit 104 measures the discharge current Id of the assembled battery 11 (Step S107). The value of the output voltage Vbat measured by the voltage measurement unit 106 is stored in the register unit 102 as the output voltage value Va (Step S108). The value of the discharge current Id measured by the current measurement unit 104 is stored in the register unit 102 as a discharge current value Ia_n (Ia_0 when the variable n is 0) (Step S108). Next, the value of the variable n increases by 1 (Step S109). After that, the step goes back to the comparison between the discharge current Id and the threshold current Ith (Step S102). In this example, the processes of No in Step S102, No in Step S103, and Steps S106 to S109 are repeatedly executed at a cycle T until n reaches 3.

Meanwhile, when n≥R (Yes in Step S103), the processing for updating the discharge current value Ia is executed. More specifically, it is determined whether the plurality of discharge current values Ia_(n−R) to Ia_(n−1) measured by the current measurement unit 104 satisfy the condition of the following Expression (8) (Step S104).

$$A \le Ia\_(n-2) - Ia\_(n-1) \le B, \text{ and} \quad (8)$$
$$A \le Ia\_(n-3) - Ia\_(n-1) \le B, \text{ and}$$
$$\ldots$$
$$A \le Ia\_(n-R) - Ia\_(n-1) \le B$$

When n=3 and R=3, for example, it is determined whether A≤Ia_1−Ia_2≤B and A≤Ia_0−Ia_2≤B are satisfied. Specifically, it is determined whether the difference between the discharge current value (first discharge current) Ia_2 which is the latest measurement value and the discharge current value (second discharge current) Ia_1 which is the previous measurement value falls within a range from the predetermined value A to the predetermined value B, and it is also determined whether the difference between the discharge current value (first discharge current) Ia_2 which is the latest measurement value and the discharge current value (third discharge current) Ia_0 which is the previous measurement value falls within a range from the predetermined value A to the predetermined value B. When both of these differences fall within a range from the predetermined value A to the predetermined value B (Yes in Step S104), the discharge current value (power calculation current) Ia used for the calculation of the maximum power amount Pmax is updated to the latest discharge current value Ia_2 (Step S105). Meanwhile, when any one of these differences does not fall within a range from the predetermined value A to the predetermined value B (No in Step S104), the discharge current value Ia is not updated to the latest discharge current value Ia_2.

When n=4 and R=3, for example, it is determined whether A≤Ia_2−Ia_3≤B and A≤Ia_1−Ia_3≤B are satisfied. Specifically, it is determined whether the difference between the discharge current value (first discharge current) Ia_3 which is the latest measurement value and the discharge current value (second discharge current) Ia_2 which is the previous measurement value falls within a range from the predetermined value A to the predetermined value B, and it is also determined whether the difference between the discharge current value (first discharge current) Ia_3 which is the latest measurement value and the discharge current value (third discharge current) Ia_1 which is the previous measurement value falls within a range from the predetermined value A to the predetermined value B. When both of these differences fall within a range from the predetermined value A to the predetermined value B (Yes in Step S104), the discharge current value (power calculation current) Ia used for the calculation of the maximum power amount Pmax is updated to the latest discharge current value Ia_3 (Step S105). Meanwhile, when any one of these differences does not fall within a range from the predetermined value A to the predetermined value B (No in Step S104), the discharge current value Ia is not updated to the latest discharge current value Ia_3.

Figure 8:
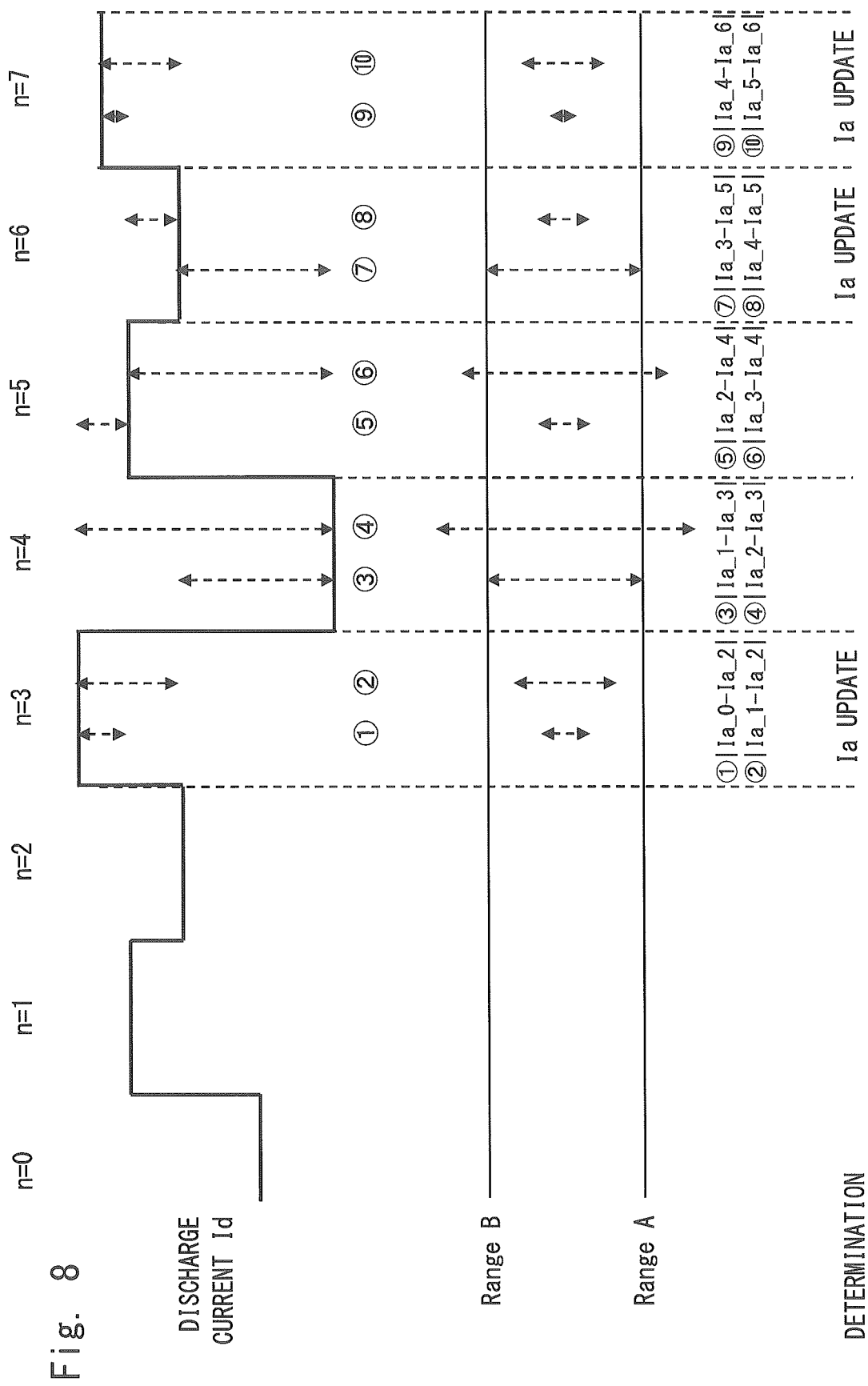
FIG. 8 is a timing chart for describing processing for updating a discharge current value Ia.

Referring to an example shown in FIG. 8, when n=3, 6, 7, and R=3, the condition of Expression (8) is satisfied. In this case, the discharge current value Ia is updated to the latest discharge current values Ia_2, Ia_5, and I_6, respectively. Meanwhile, when n is another value, the condition of Expression (8) is not satisfied. In this case, the discharge current value Ia is not updated.

After the processing for updating the discharge current value Ia, measurement of the output voltage Vbat (Step S106), measurement of the discharge current Id (Step S107), storage of the measurement results (Step S108), and the increase in the value of the variable n by one (Step S109) are executed. After that, the step goes back to the comparison between the discharge current Id and the threshold current Ith (Step S102). In this example, when n becomes 3 or larger, processes of No in Step S102, Yes in Step S103, and Steps S104 to S109 are repeatedly performed at a cycle T until when Id>Ith is satisfied.

In summary, in the normal measurement mode, the measurement of the output voltage Vbat and the discharge current Id is repeatedly executed at a cycle T. After n exceeds R, the processing for updating the discharge current value Ia is executed as well.

Next, when the discharge current Id of the assembled battery 11 exceeds the threshold current Ith (Yes in Step S102), the battery control IC 10 determines that the operation mode of the CPU 11 is the high-speed clock operation mode to change the measurement mode to the large current measurement mode (second measurement mode).

In the large current measurement mode, the voltage measurement unit 106 measures the output voltage Vbat of the assembled battery 11 (Step S110). Further, the current measurement unit 104 measures the discharge current Id of the assembled battery 11 (Step S111). The value of the output voltage Vbat measured by the voltage measurement unit 106 is stored in the register unit 102 as the output voltage value Vb (Step S112). The value of the discharge current Id measured by the current measurement unit 104 is stored in the register unit 102 as the discharge current value Ib (Step S112).

The battery control IC 10 substitutes the output voltage value Va and the discharge current value Ia measured in the normal measurement mode and the output voltage value Vb and the discharge current value Ib measured in the large current measurement mode into Expression (7) to estimate the internal resistance RCELL of the assembled battery 11, and substitutes the internal resistance RCELL that is estimated into Expression (6) to calculate the maximum power amount Pmax (Step S113). After that, the step goes back to the comparison between the discharge current Id and the threshold current Ith (Step S102).

As described above, the battery control IC 10 according to this embodiment determines, in the normal measurement mode, whether to employ the latest discharge current value as the discharge current value Ia used for the calculation of the maximum power amount Pmax based on the difference between the latest discharge current value measured by the current measurement unit 104 and the discharge current value that is previously measured. The battery control IC 10 according to this embodiment then estimates the internal resistance RCELL of the assembled battery 11 based on the output voltage value Va and the discharge current value Ia measured in the normal measurement mode and the output voltage value Vb and the discharge current value Ib measured in the large current measurement mode. The battery control IC 10 then calculates the maximum power amount Pmax which can be output from the assembled battery 11 in the high-speed clock operation mode (large current measurement mode) based on the internal resistance RCELL that is estimated. In this way, the battery control IC 10 according to this embodiment is able to estimate the internal resistance RCELL using the discharge current value Ia with high reliability, thereby being able to calculate the maximum power amount Pmax with high accuracy.

Further, the battery control IC 10 according to this embodiment includes the current detection unit 105 that detects that the discharge current Id has exceeded the threshold current Ith, thereby being able to promptly detect that the operation mode of the CPU 22 has changed from the normal clock operation mode to the high-speed clock operation mode. In this way, the battery control IC 10 according to this embodiment is able to complete the measurement of the output voltage value Vb and the discharge current value Ib of the assembled battery 11 even when the period of the high-speed clock operation mode is short, thereby being able to calculate the maximum power amount Pmax with high accuracy.

Described in this embodiment is the case in which the battery control IC 10 includes the current detection unit 105 which detects that the discharge current Id has exceeded the threshold current Ith. However, the present invention is not limited to the case in which the battery control IC 10 includes the current detection unit 105. When the operation mode of the CPU 22 is switched at a predetermined cycle, for example, it is not required to detect that the discharge current Id has exceeded the threshold current Ith. In this case, the current detection unit 105 may be omitted.

Further, while the case in which R=3 has been described in this embodiment, the present invention is not limited to this case and R may be any integer equal to or greater than two. Further, the values A and B may either be fixed values or variables.

<Second Embodiment>

Compared to the battery control IC 10 according to the first embodiment, a battery control IC 10 according to a second embodiment further includes a function of setting the threshold current Ith to a value corresponding to the discharge current value Ia.

Figure 9:
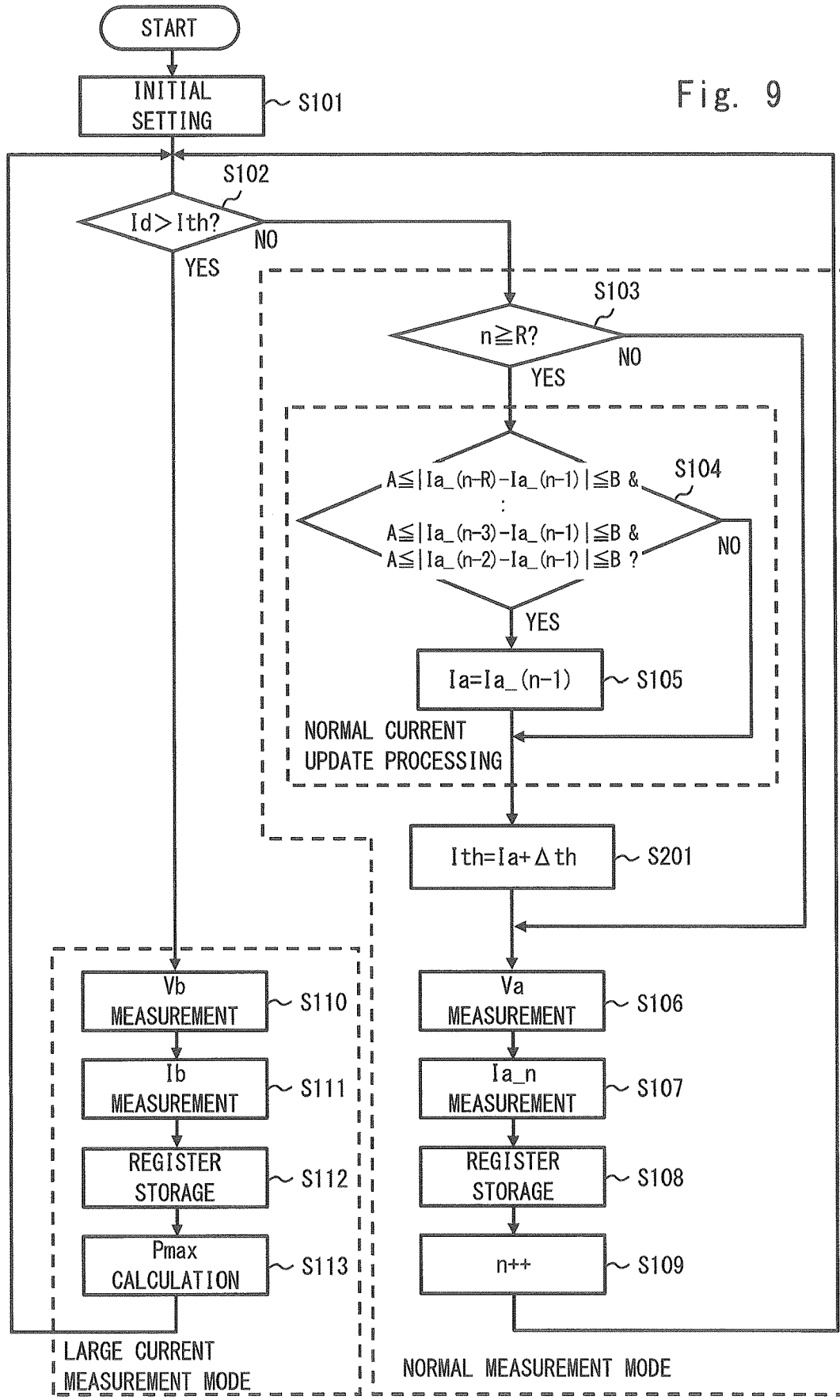
FIG. 9 is a flowchart showing an operation of a battery control IC according to a second embodiment.

FIG. 9 is a flowchart showing a flow of processing for calculating the maximum power amount Pmax by the battery control IC 10 according to this embodiment. As shown in FIG. 9, the battery control IC 10 according to this embodiment sets the threshold current Ith to a value obtained by adding the discharge current value Ia and a predetermined value Δth (Step S201) after the processing for updating the discharge current value Ia is performed. Since the other configurations and the operations of the battery control IC 10 according to the second embodiment are similar to those of the battery control IC 10 according to the first embodiment, the descriptions thereof will be omitted.

Figure 10:
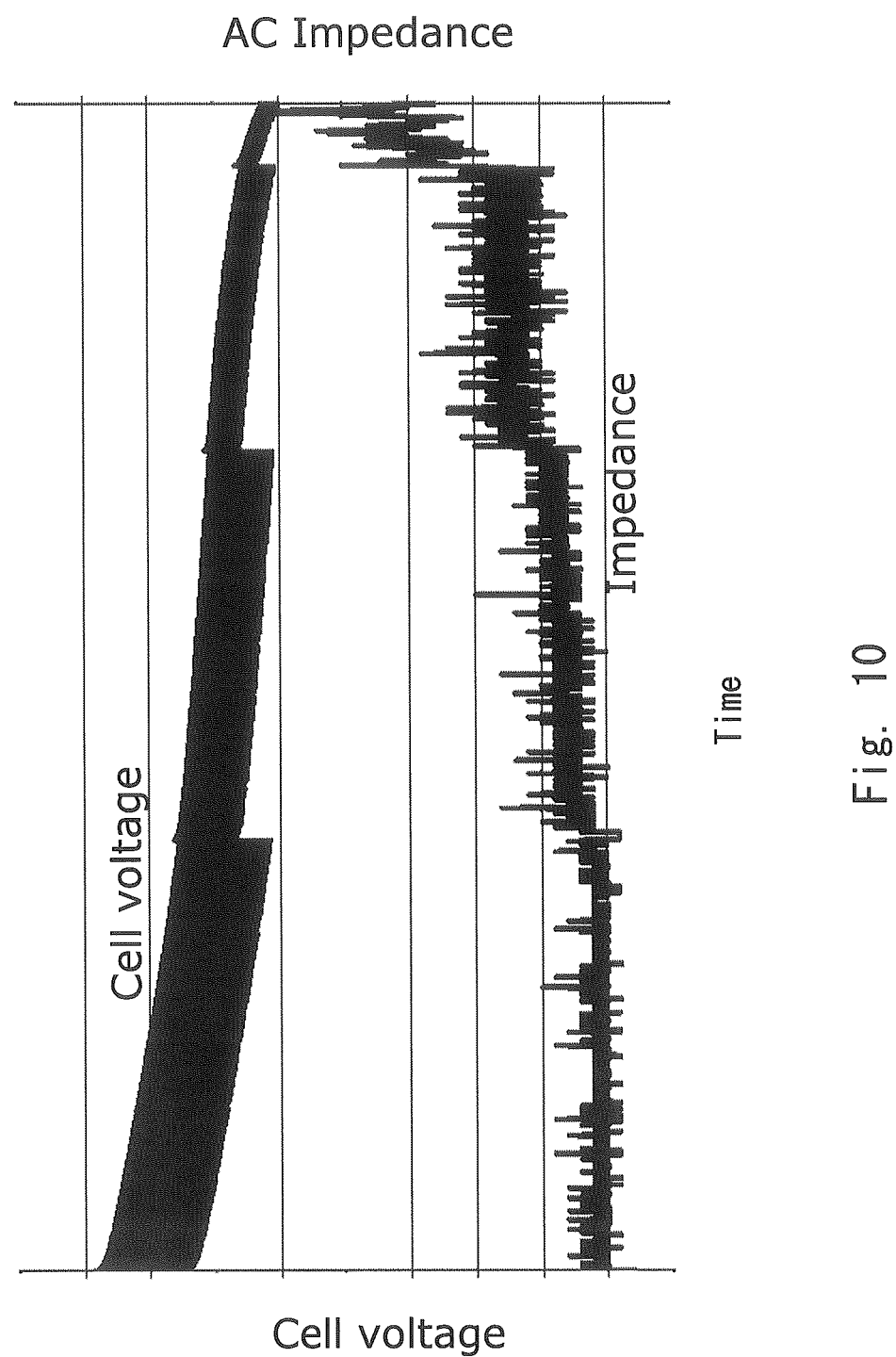
FIG. 10 is a diagram showing a relation between an internal resistance and an output voltage of a unit battery cell due to progress of discharge.

FIG. 10 is a diagram showing a relation between the internal resistance and the output voltage of the unit battery cell due to progress of discharge. As shown in FIG. 10, when the discharge of the assembled battery 11 proceeds and the battery remaining capacity decreases, the internal resistance (Impedance) RCELL of the assembled battery 11 tends to abruptly vary (increase). When the discharge of the assembled battery 11 proceeds and the battery remaining capacity decreases, the output voltage (Cell voltage) decreases and the maximum power amount Pmax decreases. Therefore, the difference of the discharge current Id of the assembled battery 11 in each clock operation mode decreases. In summary, when the discharge of the assembled battery 11 proceeds and the battery remaining capacity decreases, further accuracy is required to determine the operation mode. If the threshold current Ith is fixed in such a situation, the discharge current Id may exceed the threshold current Ith even when the mode is the normal clock operation mode or the discharge current Id may decrease to the threshold current Ith or lower even when the mode is the high-speed clock operation mode. In short, the operation mode may be erroneously determined.

The battery control IC 10 according to this embodiment sets the threshold current Ith to the value obtained by adding the discharge current value Ia and the predetermined value Δth. Therefore, with the battery control IC 10 according to this embodiment, even when the difference of the discharge current Id of the assembled battery 11 in each clock operation mode is small, the threshold current Ith can be fine tuned based on the discharge current value Ia that is updated as needed, thereby being able to suppress the erroneous determination of the operation mode. As a result, the battery control IC 10 according to this embodiment is therefore able to calculate the maximum power amount Pmax with high accuracy. At this time, since the communication from the system board 2 to the battery control IC 10 is unnecessary, the increase in the power consumption and the complicated communication can be suppressed.

<Third Embodiment>

Compared to the battery control IC 10 according to the second embodiment, a battery control IC 10 according to the third embodiment further includes a function of setting the threshold current Ith to a value corresponding to a remaining capacity RSOC (Relative State Of Charge) of the assembled battery 11, not only to a value corresponding to the discharge current value Ia.

Figure 11:
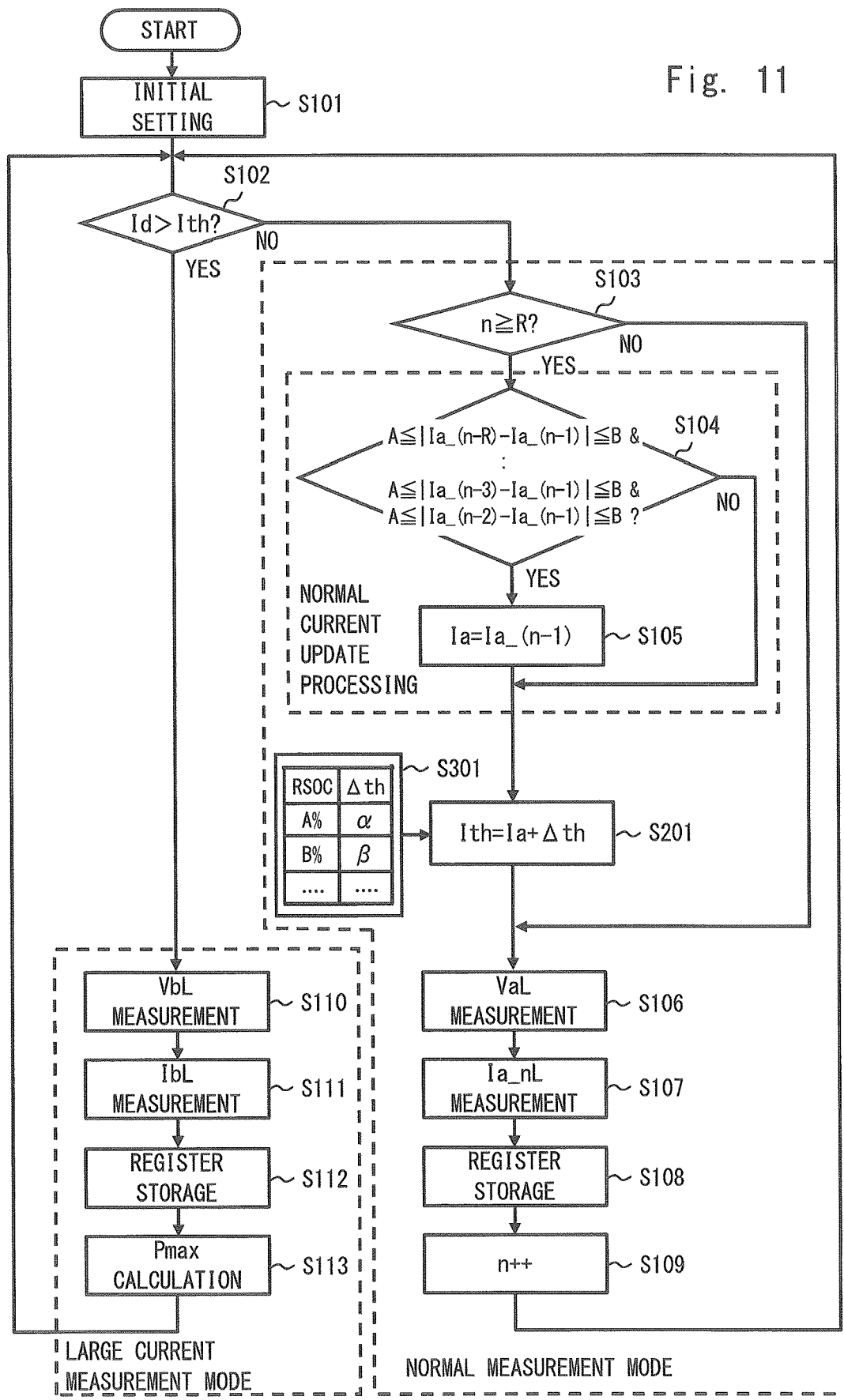
FIG. 11 is a flowchart showing an operation of a battery control IC according to a third embodiment.

FIG. 11 is a flowchart showing a flow of processing for calculating the maximum power amount Pmax by the battery control IC according to this embodiment. As shown in FIG. 11, the battery control IC 10 according to this embodiment sets, after the processing for updating the discharge current value Ia, the threshold current Ith to a value obtained by adding the discharge current value Ia and the value Δth determined according to the remaining capacity RSOC of the assembled battery 11 (Step S201).

When the remaining capacity RSOC of the assembled battery 11 is small, for example, the difference of the discharge current Id in each clock operation mode decreases. In this case, the value of Δth decreases. Meanwhile, when the remaining capacity RSOC of the assembled battery 11 is large, the difference of the discharge current Id in each clock operation mode is large. In this case, the value of Δth increases. The information of Δth according to the remaining capacity RSOC is stored, for example, in a table S301.

Since the other configurations and operations of the battery control IC 10 according to the third embodiment are similar to those of the battery control IC 10 according to the first embodiment, the descriptions thereof will be omitted.

As described above, the battery control IC 10 according to this embodiment fine tunes the threshold current Ith not only based on the discharge current value Ia that is updated as needed but also based on the remaining capacity RSOC of the assembled battery 11. The battery control IC 10 according to this embodiment is thus able to further suppress erroneous determination of the operation mode. As a result, the battery control IC 10 according to this embodiment is able to calculate the maximum power amount Pmax with higher accuracy.

As described above, the battery control IC 10 according to the first to third embodiments determines, in the normal measurement mode, whether to employ the latest discharge current value as the discharge current value Ia used to calculate the maximum power amount Pmax based on the difference between the latest discharge current value measured by the current measurement unit 104 and the discharge current value that is previously measured. The battery control IC 10 according to the first to third embodiments estimates the internal resistance RCELL of the assembled battery 11 based on the output voltage value Va and the discharge current value Ia measured in the normal measurement mode and the output voltage value Vb and the discharge current value Ib measured in the large current measurement mode, and calculates the maximum power amount Pmax which can be output from the assembled battery 11 in the high-speed clock operation mode (large current measurement mode) based on the internal resistance RCELL that is estimated. Accordingly, the battery control IC 10 according to the first to third embodiments is able to estimate the internal resistance RCELL using the discharge current value Ia with high reliability, thereby being able to calculate the maximum power amount Pmax with high accuracy.

The present invention made by the inventors has been explained above in a specific manner based on embodiments. However, the present invention is not limited to the above-described embodiments, and needless to say, various modifications can be made without departing from the spirit and scope of the present invention.

In the semiconductor device according to the above embodiments, for example, the conductive type (p-type or n-type) may be inverted in the semiconductor substrate, the semiconductor layer, the diffusion layer (diffusion region) and the like. When one conductive type of n-type and p-type is a first conductive type and the other conductive type is a second conductive type, the first conductive type may be the p-type and the second conductive type may be the n-type, or the first conductive type may be the n-type and the second conductive type may be the p-type.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor system comprising:
    a battery pack comprising a battery, and a semiconductor device including the battery pack; and
    a system board to which a CPU (Central Processing Unit) is mounted,
    wherein the CPU is configured to be switchable between a normal clock operation mode in which an operation is performed in a first clock frequency and a high-speed clock operation mode in which an operation is performed in a second clock frequency which is higher than the first clock frequency, and
    wherein the semiconductor device comprises:
    a voltage measurement circuit that measures an output voltage of the battery;
    a current measurement circuit that measures a discharge current of the battery; and
    a controller that determines, in the normal clock operation mode, whether to employ a first discharge current as a power calculation current based on a difference between the first discharge current and a second discharge current, the first discharge current being the discharge current measured by the current measurement circuit, and the second discharge current being the discharge current measured by the current measurement circuit before the first discharge current is measured, and
    wherein the controller estimates an internal resistance of the battery based on the power calculation current and the output voltage measured in the normal clock operation mode and the discharge current and the output voltage measured in the high-speed clock operation mode, and calculates, based on the internal resistance that is estimated, a maximum power amount that can be output by the battery in the high-speed clock operation mode.

2. The semiconductor system according to claim 1, wherein the controller employs the first discharge current as the power calculation current when the difference between the first discharge current and the second discharge current is within a predetermined range.

3. The semiconductor system according to claim 1, wherein the controller determines whether to employ the first discharge current as the power calculation current based on a difference between the first discharge current and a third discharge current which is the discharge current measured by the current measurement circuit before the second discharge current is measured in addition to the difference between the first discharge current and the second discharge current.

4. The semiconductor system according to claim 3, wherein the controller employs the first discharge current as the power calculation current when the difference between the first discharge current and the second discharge current is within a predetermined range and the difference between the first discharge current and the third discharge current is within the predetermined range.

5. The semiconductor system according to claim 1,
    wherein the semiconductor device further comprises a current detection circuit that detects whether the discharge current has exceeded a threshold current, and
    wherein the controller sets a measurement mode to the normal clock operation mode when the discharge current is equal to or lower than the threshold current and sets the measurement mode to the high-speed clock operation mode when the discharge current exceeds the threshold current.

6. The semiconductor system according to claim 5, wherein the controller employs the first discharge current as the power calculation current when the difference between the first discharge current and the second discharge current is within a predetermined range.

7. The semiconductor system according to claim 5, wherein the controller determines whether to employ the first discharge current as the power calculation current based on a difference between the first discharge current and a third discharge current which is the discharge current measured by the current measurement circuit before the second discharge current is measured in addition to the difference between the first discharge current and the second discharge current.

8. The semiconductor system according to claim 7, wherein the controller employs the first discharge current as the power calculation current when the difference between the first discharge current and the second discharge current is within a predetermined range and the difference between the first discharge current and the third discharge current is within the predetermined range.

9. The semiconductor system according to claim 5, wherein the threshold current indicates a predetermined value that is determined in advance.

10. The semiconductor system according to claim 5, wherein the controller sets a value of the threshold current to a value corresponding to the power calculation current.

11. The semiconductor system according to claim 5, wherein the controller sets a value of the threshold current to a value obtained by adding a value of the power calculation current and a predetermined value.

12. The semiconductor system according to claim 5, wherein the controller sets a value of the threshold current to a value obtained by adding the power calculation current and a value determined according to a remaining capacity of the battery.

* * * * *